United States Patent [19]

Yamazaki

[11] Patent Number: 4,751,663
[45] Date of Patent: Jun. 14, 1988

[54] IIR DIGITAL FILTER

[75] Inventor: Takao Yamazaki, Kanagawa, Japan

[73] Assignee: Sony Corporation, Tokyo, Japan

[21] Appl. No.: 685,127

[22] Filed: Dec. 21, 1984

[30] Foreign Application Priority Data

Dec. 23, 1983 [JP] Japan ................................ 58-243488

[51] Int. Cl.⁴ .............................................. G06F 7/38
[52] U.S. Cl. .................................................. 364/724
[58] Field of Search ......................................... 364/724

[56] References Cited

U.S. PATENT DOCUMENTS

| | | | |
|---|---|---|---|
| 3,619,586 | 11/1971 | Hoff, Jr. et al. | 364/724 |
| 3,928,755 | 12/1975 | Bellanger et al. | 364/724 |
| 4,021,654 | 5/1977 | Harris et al. | 364/724 |
| 4,117,541 | 9/1978 | Ali | 364/724 |
| 4,255,794 | 3/1981 | Nakayama | 364/724 |
| 4,317,092 | 2/1982 | Potter | 364/724 |
| 4,488,251 | 12/1984 | Wischerman | 364/724 |
| 4,531,221 | 7/1985 | Chung et al. | 364/724 |
| 4,563,681 | 1/1986 | Godard | 364/724 |

FOREIGN PATENT DOCUMENTS 197901 1/1979 United Kingdom ................. 364/724

Primary Examiner—Gary V. Harkcom
Assistant Examiner—Dale M. Shaw
Attorney, Agent, or Firm—Lewis H. Eslinger

[57] ABSTRACT

In an IIR digital filter, the same polynomial is multiplied to both the denominator and the numerator of the system function for the IIR digital filter so as to eliminate the first order term from the denominator of the system function. Thereby, an IIR digital filter for a high-speed signal can be attained using an operation element of relatively low speed and small power consumption.

3 Claims, 3 Drawing Sheets

IIR DIGITAL FILTER

BACKGROUND OF THE INVENTION

1. Field of the Invention

The present invention relates to an IIR digital filter applied to color video signals.

2. Description of the Prior Art

An IIR digital filter is a filter having sharp characteristics at lower order. The IIR digital filter has a feedback constitution as shown in FIG. 1. As clearly seen from FIG. 1, a present input signal is supplied from an input terminal designated by numeral 1 to one input terminal of an adder 2, and a past output signal stored in a unit delay circuit 3 is multiplied by coefficient in a multiplying circuit 4 and then supplied to another input terminal of the adder 2, and the output of the adder 2 is taken through the unit delay circuit 3 to an output terminal 5.

For example, if a system function H(Z) is expressed by $$H(Z) = \frac{1 + a_1 Z^{-1} + a_2 Z^{-2}}{1 - b_1 Z^{-1} + b_2 Z^{-2}} \tag{1}$$

an IIR digital filter of second order corresponding to this H(Z) is constituted as shown in FIG. 2.

In FIG. 2, input signal $x_1$ from an input terminal 10 is supplied to an adder 11. The added output of the adder 11 is supplied to a unit delay circuit 12, and the output of the unit delay circuit 12 is supplied to another unit delay circuit 13. The output of the unit delay circuit 12 is multiplied by a multiplying circuit 14 of coefficient $b_1$ and supplied to the adder 11. The output of the unit delay circuit 13 is multiplied by a multiplying circuit 15 of coefficient $b_2$ and supplied to the adder 11. The output of the adder 11 is supplied to another adder 16, and the output of the unit delay circuit 12 and the output of the unit delay circuit 13 are multiplied by a multiplying circuit 17 of coefficient $a_1$ and a multiplying circuit 18 of coefficient $a_2$ respectively, and then both multiplying outputs are supplied to the adder 16. The output of the adder 16 is supplied to an output terminal 19, and output signal $Y_1$ is taken from the output terminal 19.

As shown in FIG. 2, the IIR digital filter has a feedback constitution including the multiplying circuits 14 and 15. This constitution corresponds to the polynomial in the denominator of expression (1).

For example, when a color video signal is digitized by a sampling pulse of $4f_{sc}$ ($f_{sc}$: color subcarrier frequency), one sampling clock period is 70 n sec. If the color video signal is processed using the IIR digital filter shown in FIG. 2, the term $b_1 Z^{-1}$ including $Z^{-1}$ in the denominator must be processed by a product/sum operation composed of multiplication and addition in a short time of 70 n sec. Since this processing requires time particularly for the multiplication, an operation element of low speed and small power consumption, such as CMOS, cannot be used, but that of high speed and large power consumption, such as a bipolar element or ECL element, can only be used.

SUMMARY OF THE INVENTION

Accordingly, an object of the invention is to provide an IIR digital filter which can be applied to processing of color video signals or the like and uses an operation element of low speed and small power consumption, such as CMOS.

The invention is an IIR digital filter wherein the same polynomial multiplies both the denominator and numerator of the system function of the IIR digital filter, so that at least the $Z^{-1}$ term is eliminated among terms in the denominator of the system function and pipeline processing is applied to the product/sum operation composed of coefficient multiplication and addition in the system function after transformation.

DESCRIPTION OF THE PREFERRED EMBODIMENT

An embodiment of the invention will now be described referring to the accompanying drawings.

For example, the system function of second-order section of the IIR digital filter as shown in the above expression (1) is $$H(Z) = \frac{1 + a_1 Z^{-1} + a_2 Z^{-2}}{1 - b_1 Z^{-1} + b_2 Z^{-2}}$$

where the denominator includes a $Z^{-1}$ term. Terms in the denominator become the feedback constitution as above described. Particularly, the term including $Z^{-1}$ in the denominator must be processed by multiplication and addition in one clock period and therefore pipeline processing cannot be executed. In order to eliminate the $Z^{-1}$ term in the denominator of the system function as shown in expression (1), the same polynomial $$(1 - b_2 Z^{-2}) + b_1 Z^{-1}$$

is multiplied to both the denominator and the numerator.

$$H(Z) = \frac{1 + a_1 Z^{-1} + a_2 Z^{-2}}{1 - b_1 Z^{-1} + b_2 Z^{-2}} \times \frac{(1 - b_2 Z^{-2}) + b_1 Z^{-1}}{(1 - b_2 Z^{-2}) + b_1 Z^{-1}} \tag{2}$$

$$= \frac{(1 + a_1 Z^{-1} + a_2 Z^{-2})(1 + b_1 Z^{-1} - b_2 Z^{-2})}{1 - (2b_2 - b_1^2) Z^{-2} + B_2^2 Z^{-4}}$$

In the system function H(Z) shown in expression (2), the term including $Z^{-1}$ is eliminated from the denominator. Consequently, the product/sum operation to be executed in one clock period may be done during two clock periods. This enables application of the pipeline processing to the product/sum operation as shown in FIG. 3.

Figure 3:
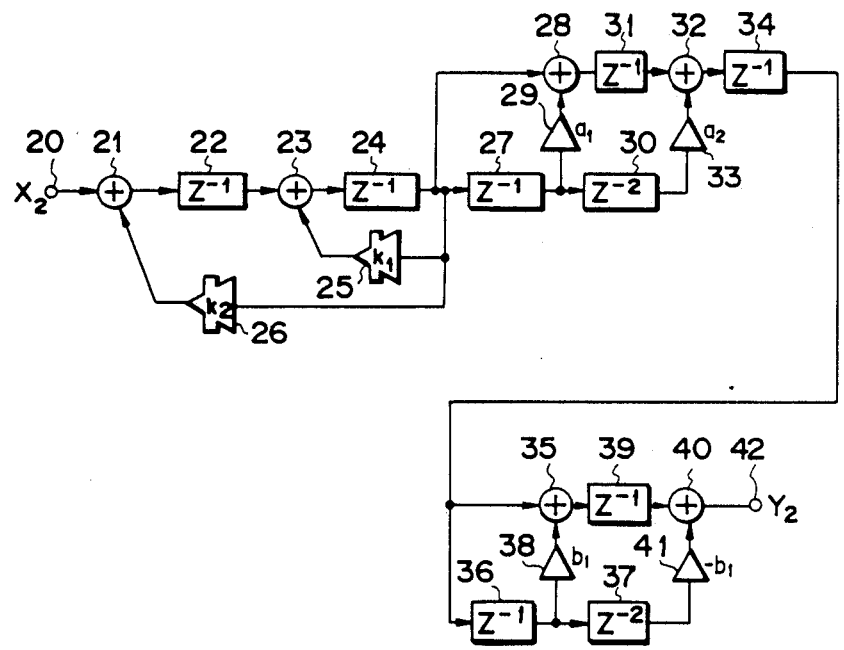
FIG. 3 is a block diagram of an embodiment of the invention.

FIG. 3 shows an IIR digital filter designed on the basis of expression (2), and numeral 20 in FIG. 3 designates an input terminal. Color video signal $x_2$ digitized by a sampling pulse of $4f_{sc}$, for example, is supplied from the input terminal 20 to an adder 21. The added output of the adder 21 is supplied to a unit delay circuit 22, and output of the unit delay circuit 22 is supplied to an adder 23, and further the added output of the adder 23 is supplied to a unit delay circuit 24. The output of the unit delay circuit 24 is supplied to a multiplying circuit 25 in pipeline processing and also to a multiplying circuit 26 in pipeline processing. The multiplying circuit 25 is one having coefficient $(K_1=2b_2+b_1^2)$, and pipeline processing in one step is executed using a register for example. The multiplying circuit 26 is one having coefficient $(K_2=-b_2^2)$, and pipeline processing in two steps executed using a register for example. The multiplied output of the multiplying circuit 25 is supplied to the adder 23, and the multiplied output of the multiplying circuit 26 is supplied to the adder 21.

The adders 21, 23, the unit delay circuit 22, 24 and the multiplying circuits 25, 26 together execute processing corresponding to the polynomial $$1-(2b_2+b_1^2)Z^{-2}+b_2^2Z^{-4}$$

shown in the denominator of expression (2).

The output of the unit delay circuit 24 is supplied to a unit delay circuit 27 and an adder 28. The output of the unit delay circuit 27 is supplied to a multiplying circuit 29 and also to a delay circuit 30 having delay amount twice as large as the unit delay amount. The multiplying circuit 29 is one having coefficient $a_1$. The output of the multiplying circuit 29 is supplied to the adder 28, and the added output of the adder 28 is supplied to a unit delay circuit 31, and further the output of the unit delay circuit 31 is supplied to an adder 32. The output of the delay circuit 30 is supplied to a multiplier circuit 33. The multiplying circuit 33 is one having coefficient $a_2$, and the multiplied output of the multiplying circuit 33 is supplied to the adder 32. The added output of the adder 32 is supplied to a unit delay circuit 34.

The adders 28, 32, the delay circuits 27, 30, 31, 34 and the multiplying circuits 29, 33 together execute processing corresponding to the polynomial of second order $$(1+a_1Z^{-1}+a_2Z^{-2})$$

representing the factor in the numerator of expression (2).

The output of the unit delay circuit 34 is supplied to an adder 35 and a unit delay circuit 36. The output of the unit delay circuit 36 is supplied to a delay circuit 37 having a delay amount twice as large as the unit delay amount and also to a multiplying circuit 38. The multiplying circuit 38 is one having coefficient $b_1$. The multiplied output of the multiplying circuit 38 is supplied to the adder 35, and the added output of the adder 35 is supplied to a unit delay circuit 39, and further the output of the unit delay circuit 39 is supplied to an adder 40. The output of the delay circuit 37 is supplied to a multiplying circuit 41. The multiplying circuit 41 is one having coefficient $-b_1$, and the output of the multiplying circuit 41 is supplied to the adder 40.

The adders 35, 40, the delay circuits 36, 37, 39 and the multiplying circuits 38, 41 together execute processing corresponding to the polynomial of second order $$(1+b_1Z^{-1}-b_2Z^{-2})$$

representing the factor in the numerator of expression (2).

The output of the adder 40 is taken as output signal $Y_2$ from an output terminal 42.

A system function in any order of an IIR digital filter can be subjected to factorization into the product of a system function of second order and a system function of first order. Consequently, an IIR digital filter of any order can be implemented by the cascade connection of a number of IIR digital filters as shown in FIG. 3.

Figure 4:
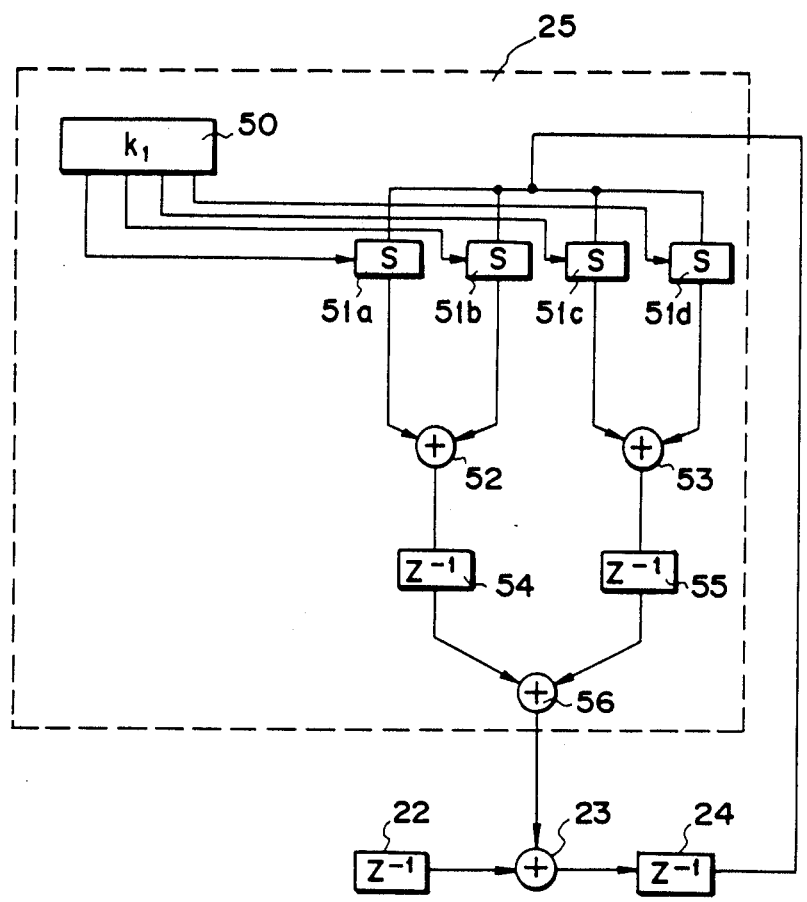
FIG. 4 is a block diagram of an example of a multiplying circuit in pipeline processing that can be used in the embodiment of FIG. 3.

FIG. 4 shows an example of multiplying circuit 25 in pipeline processing to be used in the embodiment of FIG. 3. In the example, the coefficient, i.e. digital signal $K_1$ of multiplying circuit 25 is input as four bits and the signal $K_1$ is multiplied to the output of delay circuit 24. In the example of FIG. 4, output of the unit delay circuit 24 is supplied to selectors 51a-51d and selected by each bit signal of multiplier $K_1$ supplied to each selector. For example, when the multiplier $K_1$ is 1001, the selectors 51a, 51d are turned on and a partial product signal is taken at the output side thereof, and the output of the selector 51a is shifted by one bit to the left and supplied to an adder 52. The output of the selector 51d is supplied to an adder 53. In a usual multiplying circuit, the output of the adder 52 is shifted by two bits to the left and added in an adder 56. Thereby a multiplied output is obtained from outputs of the adders 52, 53. In the example of FIG. 4, however, unit delay circuits 54, 55 are inserted at the output side of the adders 52, 53 and pipeline processing is executed. Since the pipeline processing is executed by inserting the unit delay circuits 54, 55, the select operation by the selectors 51a-51d and the adding operation by the adders 52, 53 are performed during one sample period. The adding operation by the adder 56 and the adder 23 to add the output of the adder 56 and the output of the delay circuit 22 may be performed during one sample period, thereby the operation cycle time can be halved. Although an adder of tree form is used for adding the partial products in the example, another adding system may be used. Also in the example, the multiplier $K_1$ is four bits and the number of adding steps may be relatively small. However, it is clear that if the multiplier $K_1$ is eight bits or more the number of adding steps increases and effect of pipeline processing further increases. Although an example of a usual parallel multiplying circuit is disclosed in FIG. 4, an encoder using Booth algorithm may be used to form the partial products.

In the multiplying circuit 25, since pipeline processing of one step is executed the delay circuit of one step among the unit delay circuits 54, 55 will do, but the pipeline processing of two steps is necessary in the multiplying circuit 26. In this case, a unit delay circuit may be inserted between the adder 56 and the adder 23 in FIG. 4. In this constitution, the operation cycle time can be made ⅓.

Figure 1:
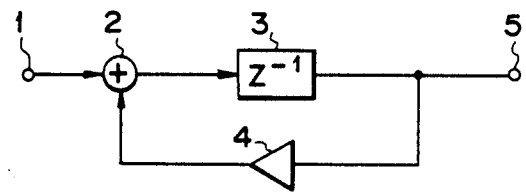
FIG. 1 is a block diagram illustrating a feedback constitution required for an IIR digital filter.
Figure 2:
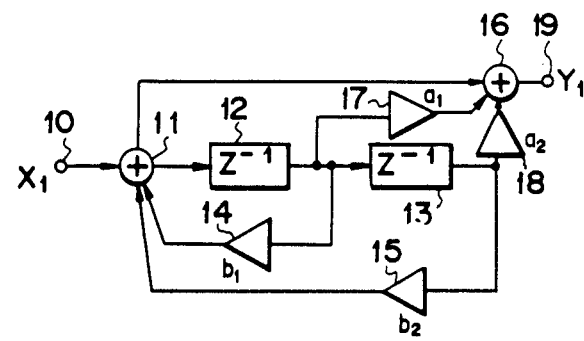
FIG. 2 is a block diagram of an IIR digital filter as an example in the prior art.

Comparing the embodiment of the invention with the IIR digital filter shown in FIG. 2, the fixed delay is increased by five steps in the embodiment so that strictly speaking the system function becomes multiplication of a $Z^{-5}$ term to expression (2). However, both are equivalent in the essential characteristics and an increase of fixed delay produces no particular problem in processing of color video signals.

In the embodiment of the invention, processing corresponding to the denominator of the system function is first executed and then processing corresponding to the numerator is executed. However, processing corresponding to the numerator may be done first and then processing corresponding to the denominator be done.

Although the numerator is constituted as the product of polynomial of second order in the embodiment, the polynomials of the numerator may be expanded into a polynomial of fourth order.

In the embodiment of FIG. 3, an adder of two-input type is used. However, if an adder of three-input type is used as shown in FIG. 2, the output of the delay circuit 22 may be connected to the input of the delay circuit 24 and be fed back from the connection of these delay circuits 22, 24 through the multiplying circuit 25 in pipeline processing to another input terminal of the adder 21 at the input side of the delay circuit 22. In this case, a separate FIR filter need not be constituted in series to the circuit constituting the IIR filter, but the delay circuits 22, 24 used to constitute the IIR filter may be also used as an FIR filter.

According to the invention, since the system function H(Z) is transformed and the $Z^{-1}$ term is eliminated from the denominator, pipeline processing of one step and two steps may be applied to the multiplying circuits 25 and 26 in the feedback loop. If the pipeline processing of one step is executed, the operation stage is divided into two steps and the operation cycle time can be made $\frac{1}{2}$. Likewise, if the pipeline processing of n steps is executed, the operation stage is divided into (n+1) steps and the cycle time can be made $1/(n+1)$. Since the system function H(Z) is transformed, the multiplying circuits 25 and 26 in the feedback loop have double word length in comparison to the multiplying circuits 14 and 15 in the feedback loop before the transformation of the system function H(Z). If the word length of either one of multiplier and multiplicand is not changed, for example, when multiplication by addition of tree form is executed, double word length of either one of multiplier and multiplicand does not cause the processing time to increase to double value. Consequently, an IIR digital filter to be used for high-speed digital signals such as video signals can be attained using an operation element of relatively low speed and small power consumption such as CMOS, so that an IIR digital filter with small power consumption and compact structure can be realized in high-density assembling.

What is claimed is:

1. A digital filter of the infinite impulse response type for filtering a digital signal sampled at a predetermined sampling frequency and having an original system function including a first order term at least in its denominator, said digital filter converting said original system function to a new system function which is equivalent to said original system function and which corresponds to the result of multiplying each of said denominator and a numerator of said original system function by the same polynomial expression such that said first order term is eliminated in a denominator of said new system function; said digital filter comprising:

first delay circuit means having an input and an output for delaying an input signal received at said input and including said digital signal for one period of said sampling frequency and producing a delayed output signal at said output;
   feedback circuit means connected between the output and input of said first delay circuit means and including multiplying circuit means for multiplying said delayed output signal by a coefficient determined by the denominator of said new system function and second delay circuit means for delaying the multiplied signal for said one period to provide a feedback signal;
   adder means for adding said input digital signal and said feedback signal of said feedback circuit means, an output signal of said adder means being supplied to said first delay circuit means as said input signal thereto;
   filter means of the finite impulse response type corresponding to said polynomial expression; and
   means for connecting said filter means to the output of said first delay circuit means.

2. A digital filter of the infinite impulse response type for filtering a digital signal sampled at a predetermined sampling frequency and having an original system function including a first order term at least in its denominator and a second order polynomial expression in said denominator, said second order polynomial expression being expressed as follows, $$H(Z) = \frac{h(Z)}{1 - b_1 z^{-1} - b_2 z^{-2}},$$

said digital filter converting said original system function to a new system function which is equivalent to said original system function and which corresponds to the result of multiplying each of said denominator and a numerator of said original system function by the same polynomial expression which is $(1-b_2 z^{-2})+b_1 z^{-1}$, such that said first order term is eliminated in a denominator of said new system function; said digital filter comprising:

first delay circuit means having an input and an output for delaying an input signal received at said input and including said digital signal for one period of said sampling frequency and producing a delayed output signal at said output;
   first feedback circuit means connected between the output and input of said first delay circuit means and including multiplying circuit means for multiplying said delayed output signal by a coefficient determined by the denominator of said new system function and second delay circuit means for delaying the multiplied signal for said one period to provide a feedback signal;
   first adder means for adding said input digital signal and said feedback signal of said first feedback circuit means, an output signal of said first adder means being supplied to said first delay circuit means as said input signal thereto;
   filter means of the finite impulse response type corresponding to said polynomial expression;
   means for connecting said filter means to the output of said first delay circuit means;
   second adder means receiving said input digital signal and third delay circuit means for delaying a received signal for said one period connected in series to supply said input digital signal to said first adder means; and
   second feedback circuit means connected between the output of said first delay circuit means and an input of said second adder means, said second feedback circuit means including second multiplying circuit means for multiplying said delayed output signal by a second coefficient determined by a denominator of said new system function and fourth and fifth delay circuit means each of which delays the multiplied signal for said one period.

3. A digital filter of the infinite impulse response type for filtering a digital signal sampled at a predetermined sampling frequency and having an original system function including a first order term at least in its denominator and a second order polynomial expression in said denominator, said second order polynomial expression being expressed as follows, $$H(Z) = \frac{h(Z)}{1 - b_1 z^{-1} - b_2 z^{-2}},$$

said digital filter converting said original system function to a new system function which is equivalent to said original system function and which corresponds to the result of multiplying each of said denominator and a numerator of said original system function by the same polynomial expression which is $(1-b_2z^{-2})+b_1z^{-1}$, so that said first order term is eliminated in a denominator of said new system function; said digital filter comprising:

first delay circuit means having an input and an output for delaying an input signal received at said input and including said digital signal for one period of said sampling frequency and producing a delayed output signal at said output;

first feedback circuit means connected between the output and input of said first delay circuit means and including multiplying circuit means for multiplying said delayed output signal by a coefficient determined by the denominator of said new system function and second delay circuit means for delaying the multiplied signal for said one period to provide a feedback signal;

adder means for adding said input digital signal and said feedback signal of said first feedback circuit means, an output signal of said adder means being supplied to said first delay circuit means as said input signal thereto;

filter means of the finite impulse response type corresponding to said polynomial expression;

means for connecting said filter means to the output of said first delay circuit means;

third delay circuit means connected to the input of said first delay circuit means for delaying said input digital signal for said one period to provide a second delayed output signal at an output; and second feedback circuit means connected between the output of said third delay circuit means and said adder means, said second feedback circuit means including second multiplying circuit means for multiplying said second delayed output signal by a second coefficient determined by the denominator of said new system function and fourth and fifth delay circuit means each of which successively delays the multiplied signal for said one period.

* * * * *